(12) United States Patent
Akers et al.

(10) Patent No.: US 10,248,343 B2
(45) Date of Patent: Apr. 2, 2019

(54) ARCHITECTURES AND TECHNIQUES FOR PROVIDING LOW-POWER STORAGE MECHANISMS

(71) Applicant: Intel Corporation, Santa Clara, CA (US)

(72) Inventors: Jason B. Akers, Beaverton, OR (US); Knut S. Grimsrud, Forest Grove, OR (US); Robert J. Royer, Jr., Portland, OR (US); Richard P. Mangold, Forest Grove, OR (US); Sanjeev N. Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/357,783

(22) Filed: Nov. 21, 2016

(65) Prior Publication Data

US 2017/0123703 A1 May 4, 2017

Related U.S. Application Data

(63) Continuation of application No. 13/537,553, filed on Jun. 29, 2012, now Pat. No. 9,530,461.

(51) Int. Cl.
*G11C 14/00* (2006.01)
*G06F 3/06* (2006.01)
*G11C 5/14* (2006.01)
*G06F 1/3287* (2019.01)
(Continued)

(52) U.S. Cl.
CPC .......... *G06F 3/0625* (2013.01); *G06F 1/3287* (2013.01); *G06F 3/0655* (2013.01); *G06F 3/0688* (2013.01); *G11C 5/148* (2013.01); *G11C 7/1072* (2013.01); *G11C 14/0009* (2013.01); *G06F 11/1417* (2013.01); *Y02D 10/171* (2018.01)

(58) Field of Classification Search
CPC .... G06F 3/0625; G06F 1/3287; G06F 3/0655; G06F 3/0688; G06F 11/1417; G11C 5/148; G11C 7/1072; G11C 14/0009; Y02D 10/171
See application file for complete search history.

(56) References Cited

U.S. PATENT DOCUMENTS 4,458,307 A 7/1984 McAnlis et al.
2002/0184438 A1* 12/2002 Usui .................... G11C 11/406
711/106
(Continued)

*Primary Examiner* — Uyen B Tran
(74) *Attorney, Agent, or Firm* — Spectrum IP Law Group LLC

(57) ABSTRACT

Techniques to utilize a very low power state with a memory subsystem that includes one or more non-volatile memory devices and a volatile memory system. A memory controller is coupled with the one or more non-volatile memory devices and the volatile memory system. The memory controller comprising at least an embedded control agent and memory locations to store state information. The memory controller to selectively enable and disable the one or more non-volatile memory devices. The memory controller transfers the state information to the volatile memory system prior to entering a low power state. Control circuitry is coupled with the memory controller. The control circuitry to selectively enable and disable operation of the memory controller.

32 Claims, 10 Drawing Sheets

(51) Int. Cl.
*G11C 7/10* (2006.01)
*G06F 11/14* (2006.01)

(56) References Cited

U.S. PATENT DOCUMENTS

| | | | |
|---|---|---|---|
| 2007/0046511 A1* | 3/2007 | Morzano | G11C 7/10 |
| | | | 341/101 |
| 2007/0094454 A1 | 4/2007 | Brundula et al. | |
| 2010/0073023 A1 | 3/2010 | Oh et al. | |
| 2011/0087913 A1 | 4/2011 | Robles et al. | |
| 2011/0125990 A1 | 5/2011 | Khosravi et al. | |
| 2012/0125990 A1 | 5/2012 | Lin | |
| 2012/0226927 A1* | 9/2012 | Kagan | G06F 1/3203 |
| | | | 713/323 |
| 2014/0310532 A1* | 10/2014 | Ali | G06F 21/81 |
| | | | 713/189 |
| 2016/0124488 A1* | 5/2016 | Haentzschel | G06F 1/3253 |
| | | | 713/323 |

\* cited by examiner

ARCHITECTURES AND TECHNIQUES FOR PROVIDING LOW-POWER STORAGE MECHANISMS

CLAIM OF PRIORITY

This application is related to, and claims priority to, non-provisional utility application filed Jun. 29, 2012, having an application Ser. No. 13/537,553 the entire contents of which are incorporated herein by reference.

TECHNICAL FIELD

Embodiments of the invention relate to electronic devices. More particularly, embodiments of the invention relate to architectures and techniques for utilizing a low-power state in an electronic device, for example, a laptop computer system or tablet device.

BACKGROUND

Electronic devices consume varying amounts of power during operation. For battery-powered devices, reduced power consumption can result in longer battery life. Thus, various techniques have been developed to reduce power consumption. However, most power-saving strategies sacrifice performance, which reduces user satisfaction.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is a protocol for entering and exiting a very low power operational (DEVSLP) state, techniques for providing the state within a storage system, etc. In various embodiments, the very low power operational state functions through a combination of a protocol, firmware (or other) functionality, and/or storage device hardware support.

A host system may cause entry into the very low power state by issuing, for example, a sleep Serial Advanced Technology Attachment (SATA) protocol command. In one embodiment an embedded agent (e.g., firmware) may respond by preparing a sleep image that may include, for example, memory controller state information, hardware state information, a buffer for storing bootloader instructions, a verification checksum, that may be stored in a dynamic memory device. The embedded agent may then cause the non-volatile memory to be powered down, or turned off, for example, by causing power to no longer be provided to the non-volatile memory.

Figure 1:
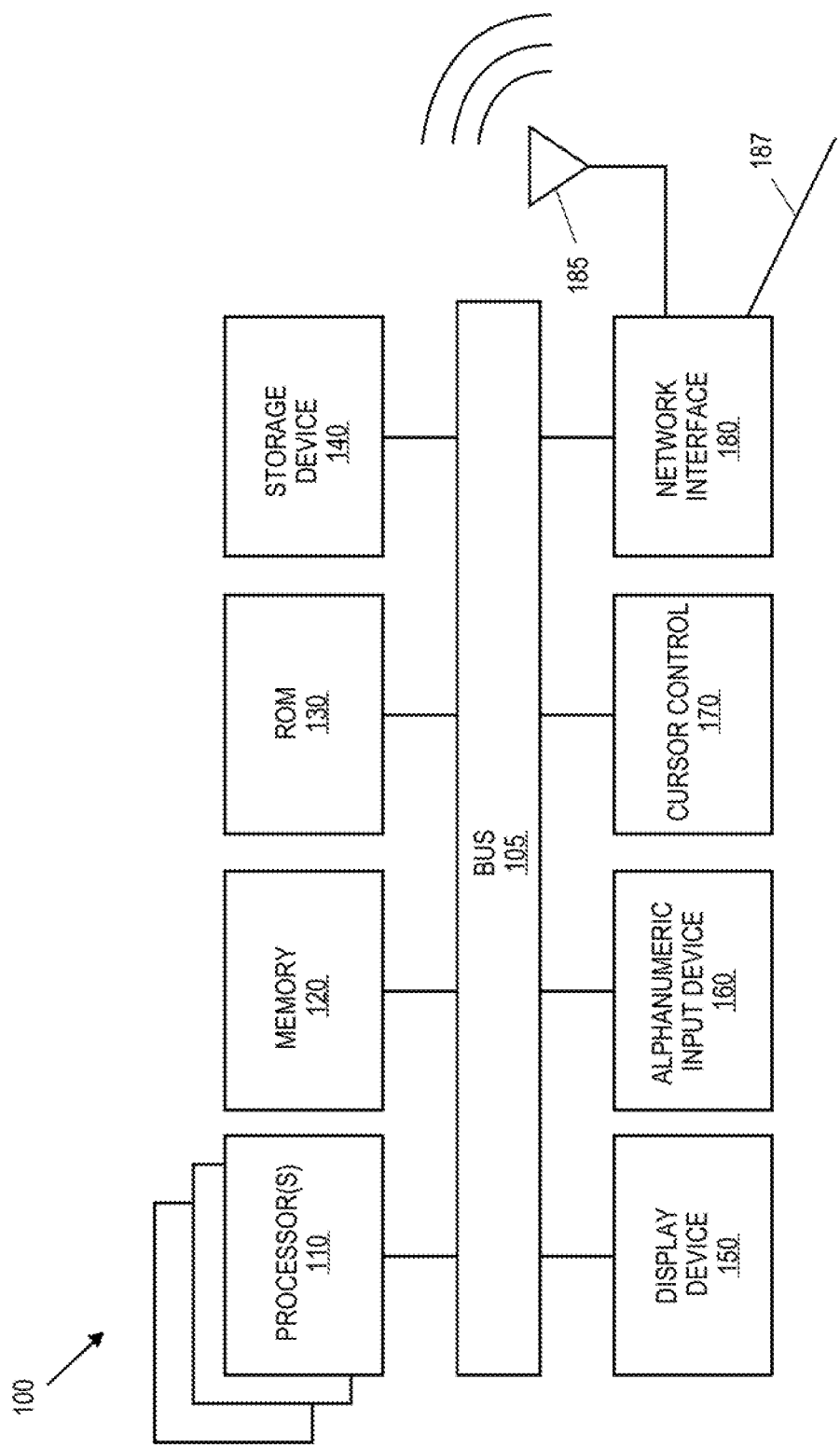
FIG. 1 is a block diagram of one embodiment of an electronic system.

FIG. 1 is a block diagram of one embodiment of an electronic system. The electronic system illustrated in FIG. 1 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

Electronic system 100 includes bus 105 or other communication device to communicate information, and processor 110 coupled to bus 105 that may process information. While electronic system 100 is illustrated with a single processor, electronic system 100 may include multiple processors and/or co-processors. Electronic system 100 further may include random access memory (RAM) or other dynamic storage device 120 (referred to as main memory), coupled to bus 105 and may store information and instructions that may be executed by processor 110. Main memory 120 may also be used to store temporary variables or other intermediate information during execution of instructions by processor 110.

Electronic system 100 may also include read only memory (ROM) and/or other static storage device 130 coupled to bus 105 that may store static information and instructions for processor 110. Data storage device 140 may be coupled to bus 105 to store information and instructions. Data storage device 140 such as a magnetic disk or optical disc and corresponding drive may be coupled to electronic system 100.

Electronic system 100 may also be coupled via bus 105 to display device 150, such as a cathode ray tube (CRT) or liquid crystal display (LCD), to display information to a user. Alphanumeric input device 160, including alphanumeric and other keys, may be coupled to bus 105 to communicate information and command selections to processor 110. Another type of user input device is cursor control 170, such as a mouse, a trackball, or cursor direction keys to communicate direction information and command selections to processor 110 and to control cursor movement on display 150.

Electronic system 100 further may include network interface(s) 180 to provide access to a network, such as a local area network. Network interface(s) 180 may include, for example, a wireless network interface having antenna 185, which may represent one or more antenna(e). Network interface(s) 180 may also include, for example, a wired network interface to communicate with remote devices via network cable 187, which may be, for example, an Ethernet cable, a coaxial cable, a fiber optic cable, a serial cable, or a parallel cable.

In one embodiment, network interface(s) 180 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 180 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Figure 2:
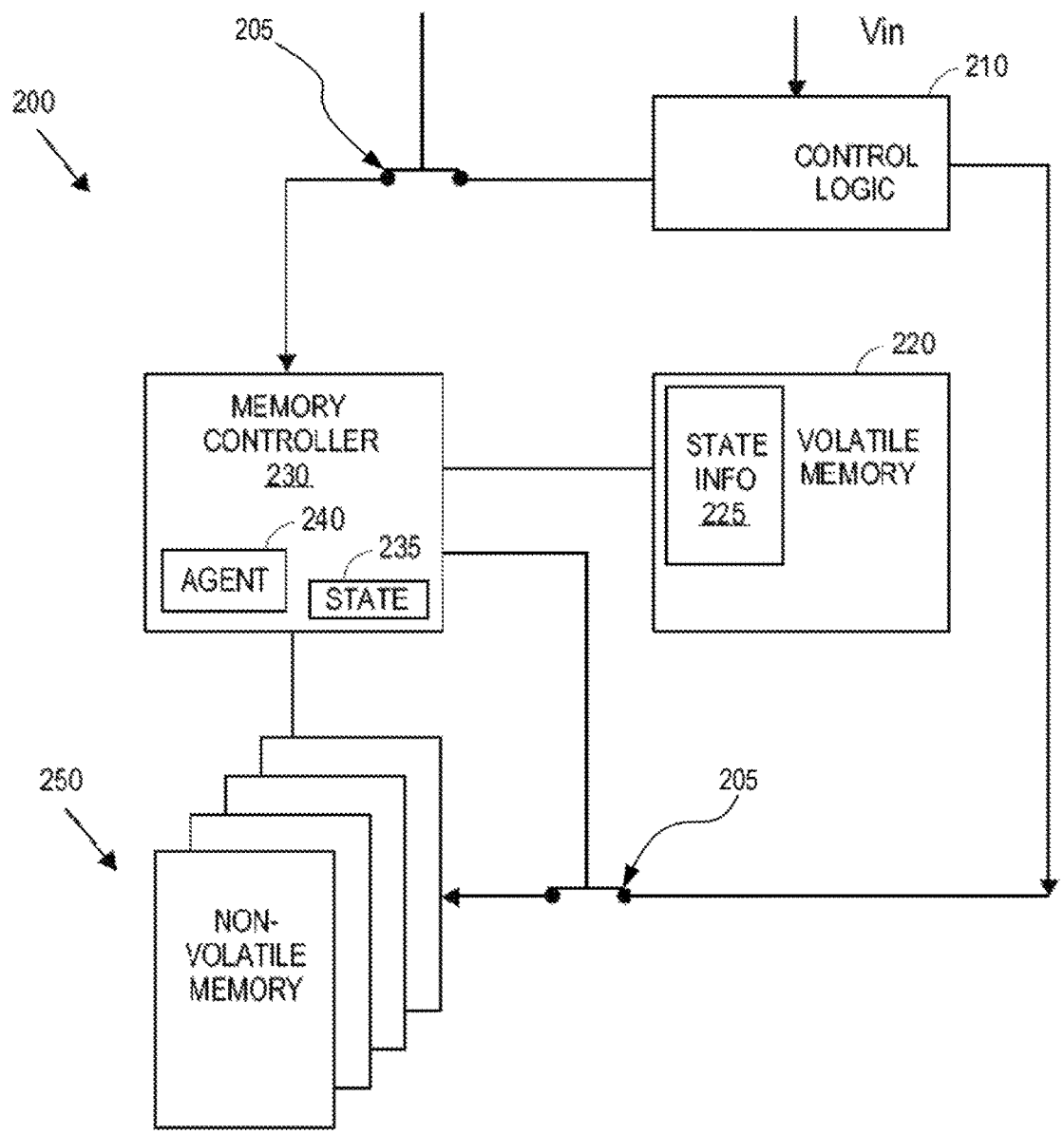
FIG. 2 is a block diagram of one embodiment of a memory subsystem that may utilize a deep sleep state as described herein.

FIG. 2 is a block diagram of one embodiment of a memory subsystem that may utilize a deep sleep state as described herein. The memory subsystem may be, for example, included within memory 120 of electronic system 100 as illustrated in FIG. 1, or within another type of electronic system.

FIG. 2 illustrates memory system 200 under normal operating conditions. Control logic 210 provides an enable signal to memory controller 230, volatile memory 220 and non-volatile memory 250. Volatile memory 220 may be, for example, dynamic random access memory (DRAM) or any other type of volatile memory. Volatile memory 220 may store state information for memory controller, 230, non-volatile memory 250 and/or other system components (not illustrated in FIG. 2).

In one embodiment, memory controller 230 includes agent 240 that operates to provide transitions 205 into and out of low power states as described herein. Agent 240 may be hardware, software, firmware or any combination thereof. In one embodiment, memory controller 230 also stores state 235, which is state information corresponding to non-volatile memory 250. Memory controller 230 may also cause state information 225 to be stored in volatile memory 220.

Thus, in the conditions illustrated in FIG. 2, each of the components of system 200 are consuming normal amounts of power, which can vary depending on the types of devices, operating environment, etc. In order to extend battery life and/or conserve power consumption, it may be desirable to reduce power consumption of as many devices as possible.

Figure 3:
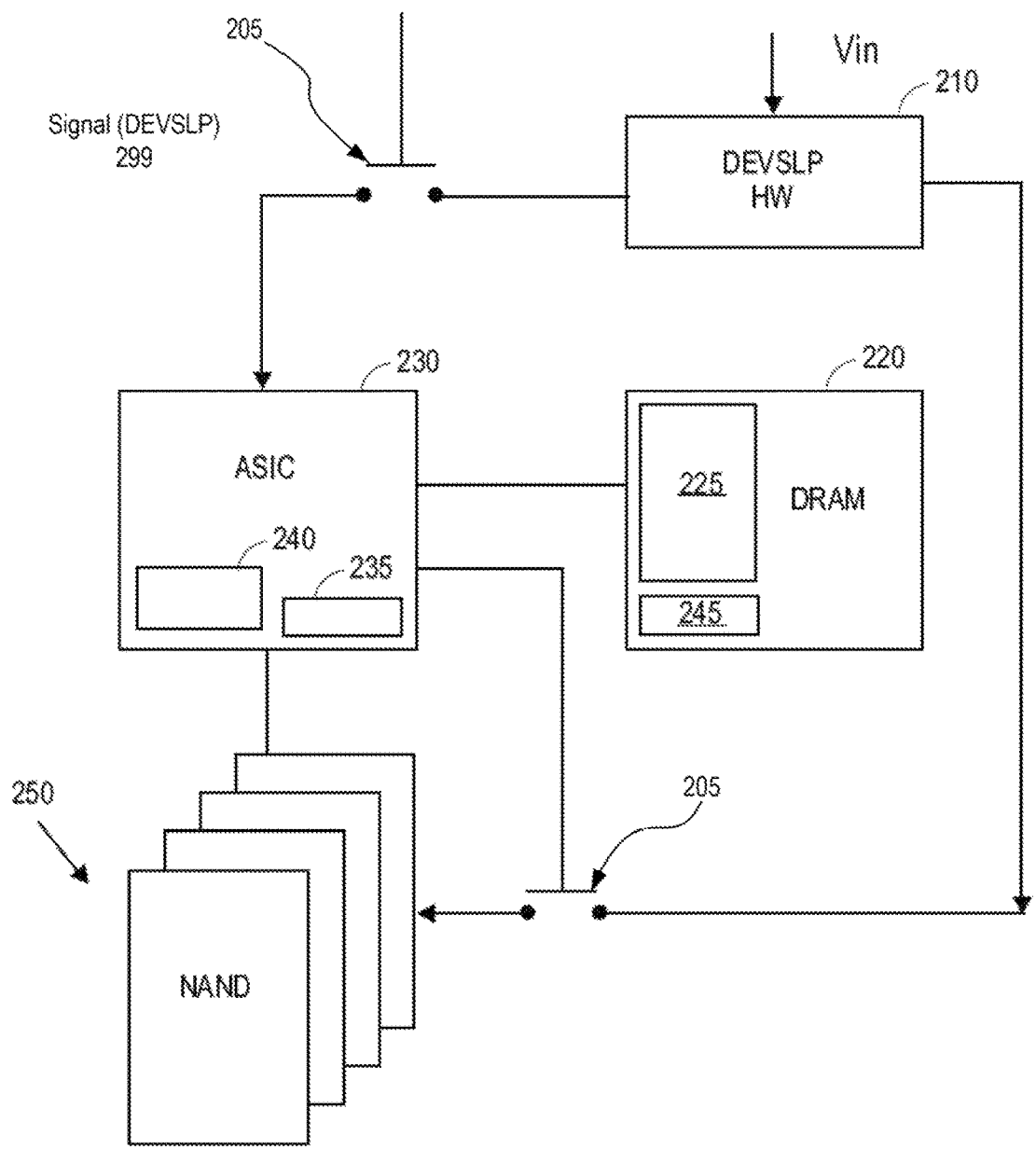
FIG. 3 is a block diagram of one embodiment of a memory subsystem that may transition to a deep sleep state as described herein.

FIG. 3 is a block diagram of one embodiment of a memory subsystem that may transition 205 to a deep sleep state as described herein. FIG. 3 illustrates conditions during a transition from normal operating mode to a reduced power state.

In the example of FIG. 3, power has been removed from non-volatile memory 250 by memory controller 230 in response to a signal 299 (e.g., DEVSLP) from a host system (not illustrated in FIG. 3). In one embodiment, agent 240 operates to cause memory controller 230 to turn off power to non-volatile memory 250. Further, agent 240 causes state information 235 to be copied to volatile memory and be stored as state information 245. Agent 240 and/or memory controller 230 may also cause volatile memory 220 to enter a low power state.

Figure 4:
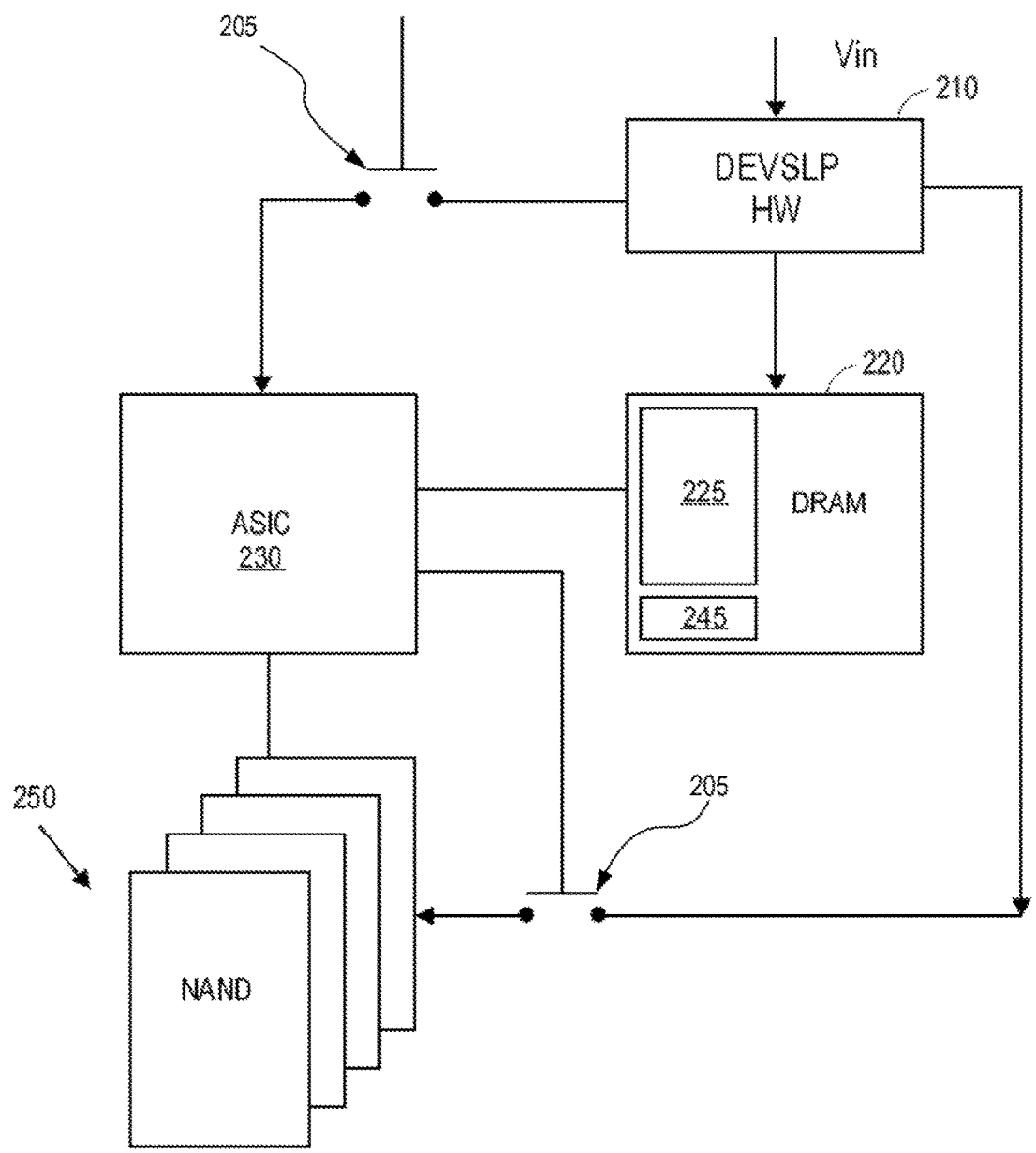
FIG. 4 is a block diagram of one embodiment of a memory subsystem that has transitioned to a deep sleep state as described herein.

FIG. 4 is a block diagram of one embodiment of a memory subsystem that has transitioned 205 to a deep sleep state as described herein. After volatile memory 220 is placed in a low power state and non-volatile memory 250 is turned off, agent 240 may cause memory controller 230 to enter a low power or no power state.

In this state, only control logic 210 and non-volatile memory 250 receive power. In one embodiment, volatile memory 220 receives only reduced power in this state. This allows system 200 to be in a lower power state than traditionally available through placing memory components in low power states.

Figure 5:
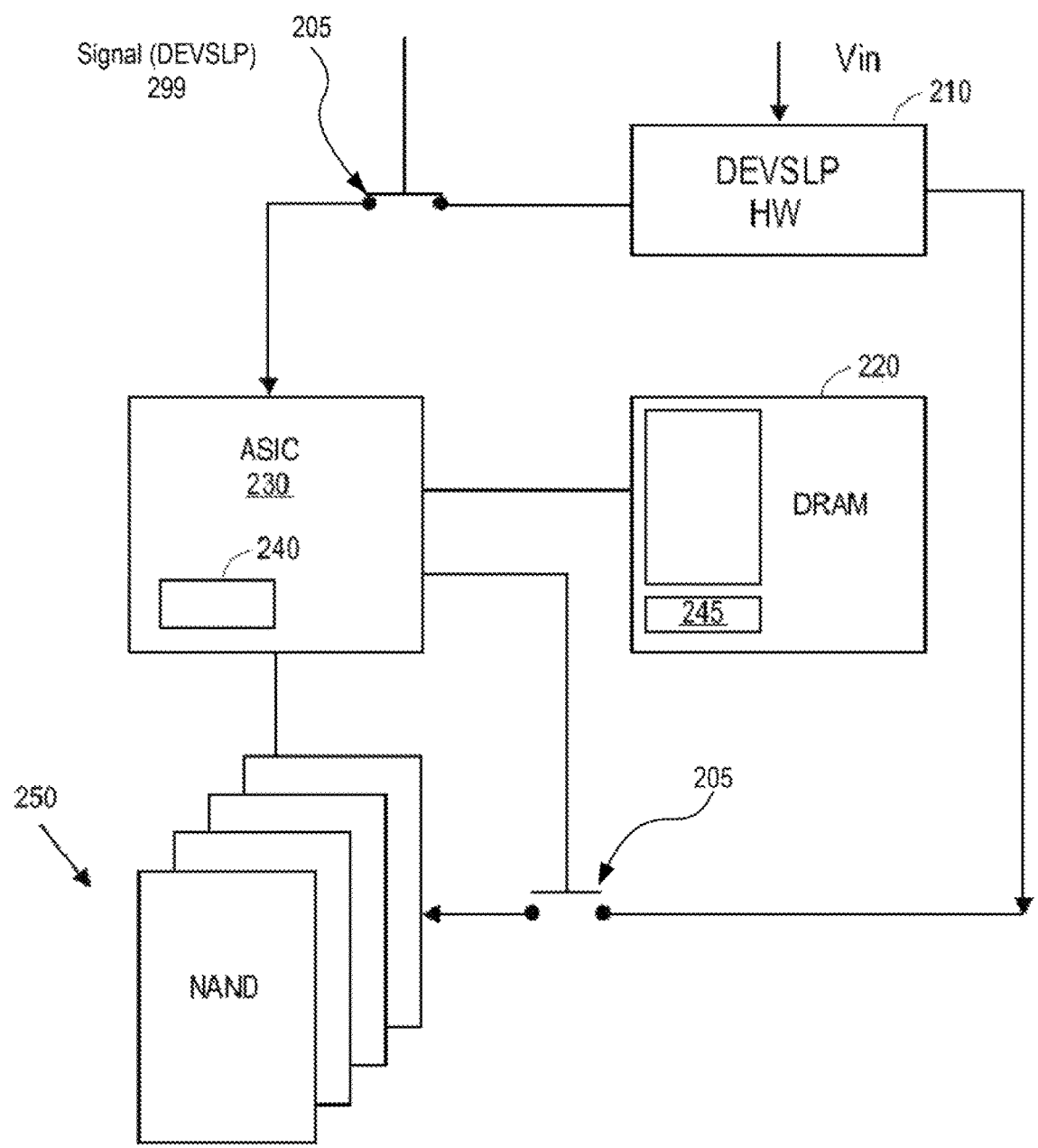
FIG. 5 is a block diagram of one embodiment of a memory subsystem that may transition out of a deep sleep state as described herein.

FIG. 5 is a block diagram of one embodiment of a memory subsystem that may transition 205 out of a deep sleep state as described herein. In response to the signal 299 (e.g., DEVSLP) state from the host system changing, control logic 210 turns memory controller 230 back on and agent 240 begins operating again.

Figure 6:
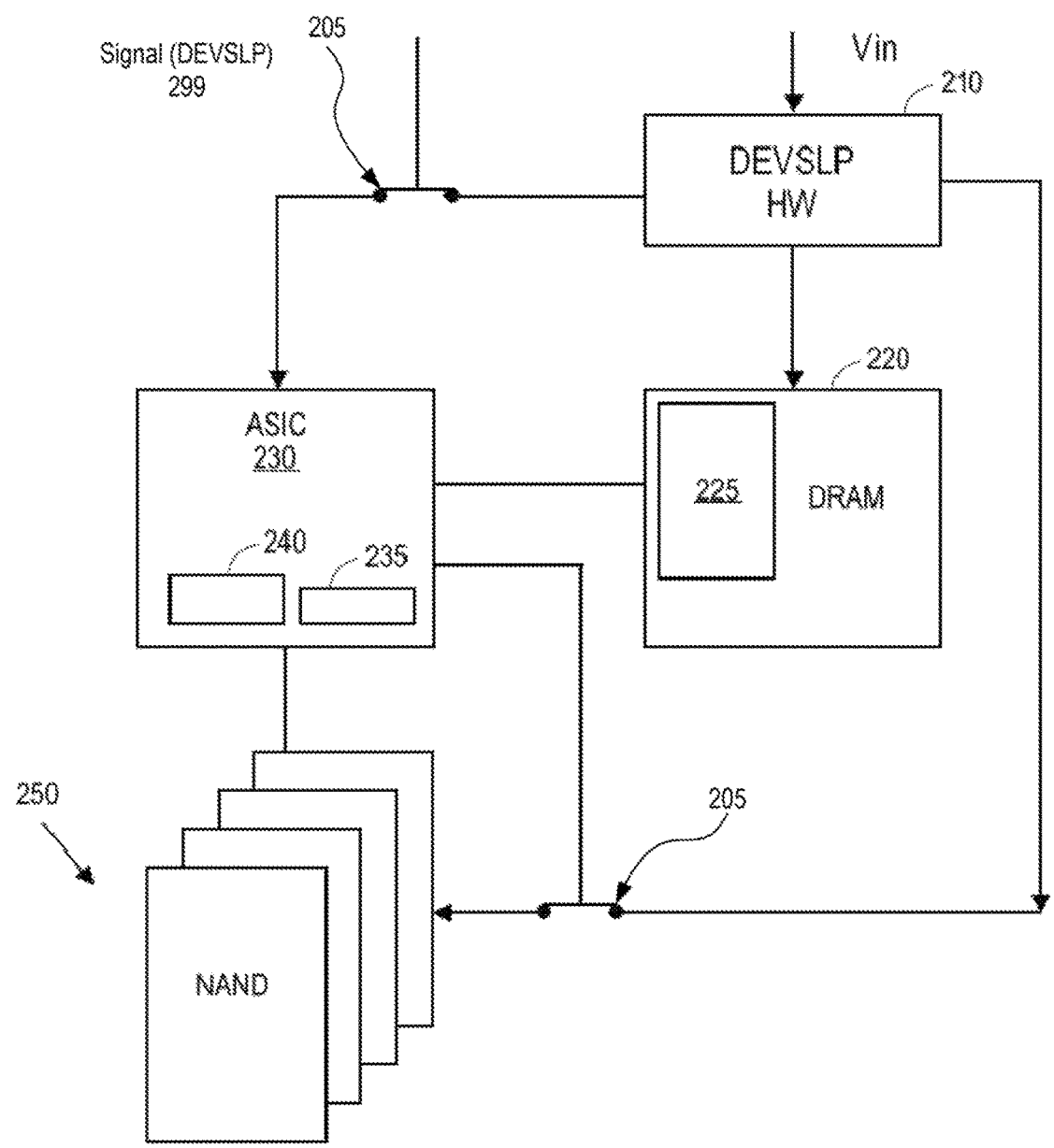
FIG. 6 is a block diagram of one embodiment of a memory subsystem that may continue the transition out of a deep sleep state as described herein.

FIG. 6 is a block diagram of one embodiment of a memory subsystem that may continue the transition 205 out of a deep sleep state as described herein. In one embodiment, agent 240 operates to restore state information 245 to memory controller 230, which allows memory controller 230 to avoid the traditional step of rebuilding state as required by traditional mechanisms when turning non-volatile memory back on. This may save considerable time and provide a better operating experience utilizing the low power state described herein.

Memory controller 230 and/or agent 240 operate to turn on non-volatile memory 250 as well as other hardware components. This restores the system illustrated in FIGS. 2-5 to normal operating state where both volatile memory 220 and non-volatile memory 250 are accessible via memory controller 230.

Figure 7:
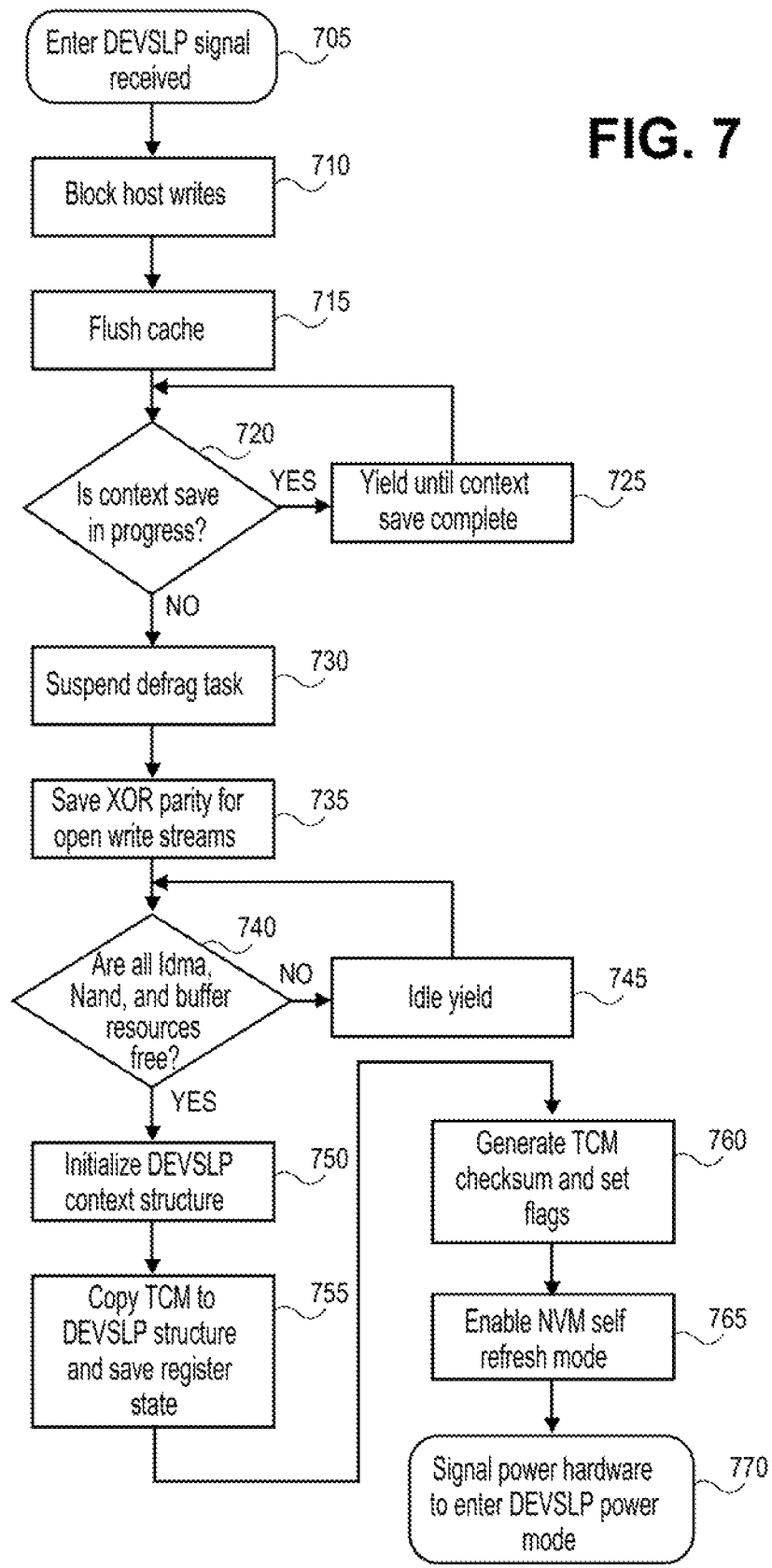
FIG. 7 is a flow diagram for one embodiment of entering a low power state.

FIG. 7 is a flow diagram for one embodiment of entering a low power state. The technique of FIG. 7 may be used, for example, with the components illustrated in FIGS. 2-6. One example is provided in FIG. 7 and one or more operations described herein may be accomplished in a different order and some steps may be optional.

A host system generates/asserts a signal to enter the sleep (or low power) state ("DEVSLP"), 705. This signal may be generated/asserted in any manner known in the art. For example, the signal may be under the control of a host operating system that monitors system conditions. As another example, the signal may respond to a hard input, such as a button, to allow a user to cause the system to enter the low power state. Other options can also be supported.

Writes from the host system are blocked, 710. This can be accomplished by memory controller 230, or by the memory controller in response to a signal from agent 240. One or more caches may be flushed 715, depending on the cache structure being utilized in the system. This can be accomplished by memory controller 230, or by the memory controller in response to a signal from agent 240.

If a context save is in progress, 720, the process yields until the context save is complete, 725. If a context save is not in progress, 720, any defragmentation tasks are suspended, 730 and parity information for open write streams can be saved, 735.

If direct memory access, non-volatile memory and buffer resources are not free, 740, the process will idle, 745. If direct memory access, non-volatile memory and buffer resources are free, 740, a context structure is initialized, 750. Memory controller state information is copied to the context structure, which is saved along with register state information, 755.

In one embodiment, a checksum is generated for the context information and associated flags are set, 760. Non-volatile memory self-refresh mode is enabled, 765 and the remaining hardware (e.g., memory controller, non-volatile memory) enter a very low power, or no power mode, 770.

Figure 8:
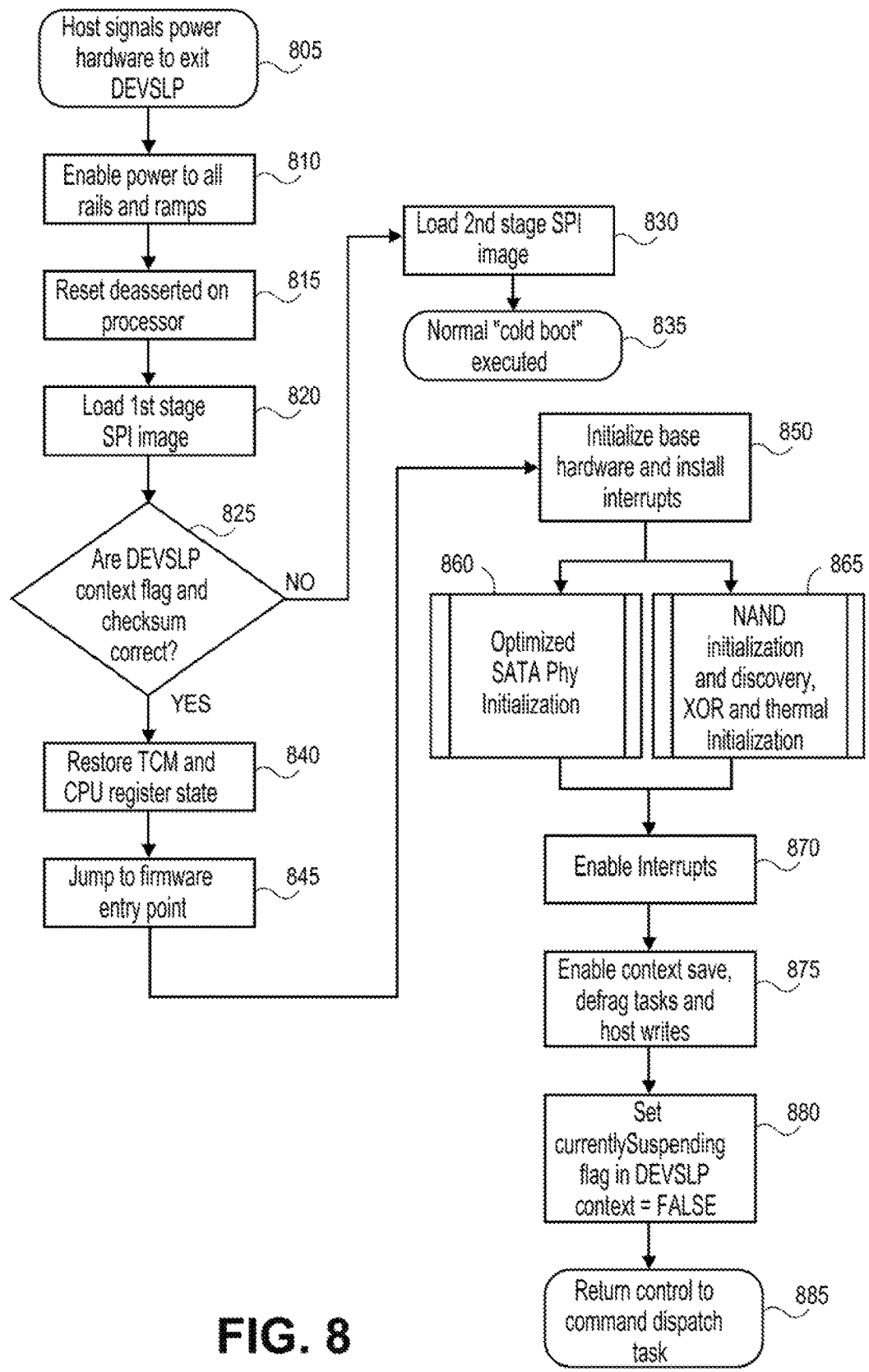
FIG. 8 is a flow diagram for one embodiment of exiting a low power state.

FIG. 8 is a flow diagram for one embodiment of exiting a low power state. The technique of FIG. 8 may be used, for example, with the components illustrated in FIGS. 2-6.

A host system generates/asserts a signal to exit the sleep (or low power) state, 805. This signal may be generated/asserted in any manner known in the art. For example, the signal may be under the control of a host operating system that monitors system conditions. As another example, the signal may respond to a hard input, such as a button, to allow a user to cause the system to enter the low power state. Other options can also be supported.

Power is enabled to the power distribution network, 810. In one embodiment, a reset signal is deasserted on a processor, 815. The first stage of the sleep image is loaded, 820. If the checksums for the sleep image are incorrect, 825, a second stage of the image is loaded, 830 and a cold boot is executed, 835. If the checksums are correct, 825, the memory controller and register state are restored, 840 and execution may jump to a firmware entry point, 845.

Base hardware elements are initialized and interrupts are installed, 850. In one embodiment, an optimized physical layer initialization is performed, 860, and non-volatile memory is initialized, 865. Interrupts are enabled, 870. Context save, defragmentation tasks and host write functionality are enabled, 875. The system is marked as not being in the deep sleep (DEVSLP) mode, 880. Control is returned to the task, 885.

Techniques to utilize a very low power state with a memory subsystem that includes one or more non-volatile memory devices and a volatile memory system. A memory controller is coupled with the one or more non-volatile memory devices and the volatile memory system. The memory controller comprising at least an embedded control agent and memory locations to store state information. The memory controller to selectively enable and disable the one or more non-volatile memory devices. The memory controller transfers the state information to the volatile memory system prior to entering a low power state. Control circuitry is coupled with the memory controller. The control circuitry to selectively enable and disable operation of the memory controller.

In one embodiment, the embedded control agent comprises firmware within the memory controller. In response to a signal from the control circuitry, the firmware causes a state corresponding to the memory controller to be copied to the volatile memory system, causes the one or more non-volatile memory devices to be turned off, and causes the volatile memory system to enter a low power state. In one embodiment, in response to a change in the signal from the control circuitry, the memory controller is enabled.

In one embodiment, in response to the change in the signal from the control circuitry, the firmware causes the state information from the non-volatile memory to be restored to the memory controller. In one embodiment, in response to the change in the signal from the control circuitry, the firmware causes the one or more non-volatile memory devices to be turned on.

The one or more non-volatile memory devices can be at least one NAND flash memory device. In one embodiment, the non-volatile memory subsystem comprises dynamic random access memory (DRAM). In one embodiment, the DRAM is at least compliant with one or more DDR-3 or later standards.

Figure 9:
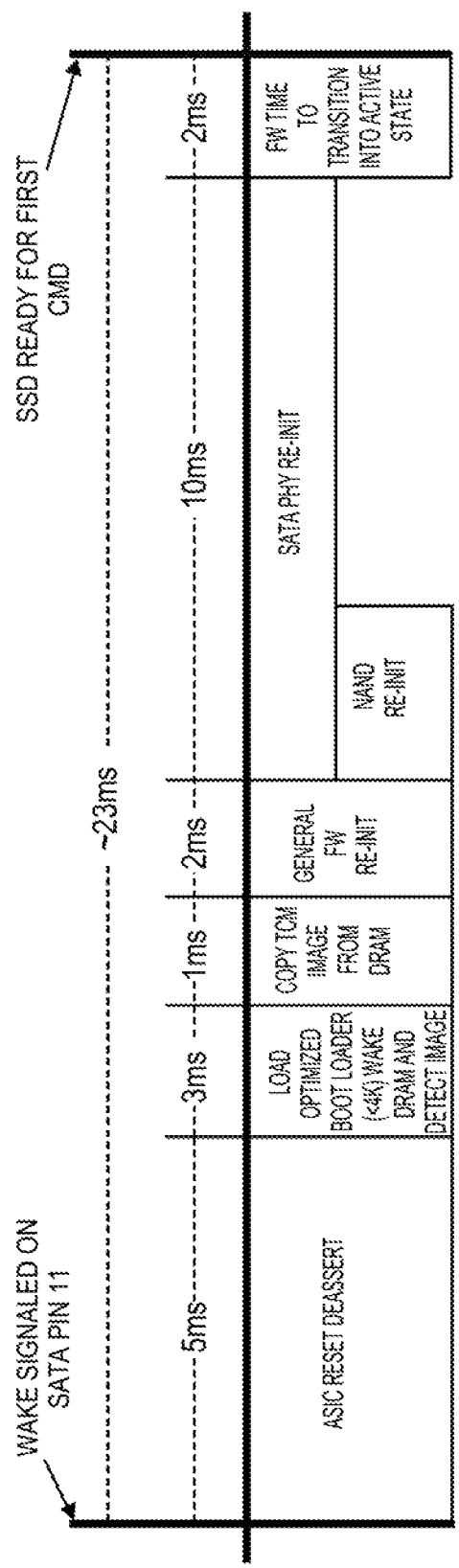
FIG. 9 is a timing diagram corresponding to an exit from a low power state following one embodiment of the techniques described herein.

FIG. 9 is a timing diagram corresponding to an exit from a low power state following one embodiment of the techniques described herein. The timing diagram for operation of a solid state drive (SSD).

In one embodiment, a host system indicates entry into a low power (e.g., DevSleep) mode by issuing a sleep Serial Advanced Technology Attachment (SATA) command or by modifying a general purpose input/output (GPIO) register through chipset support. The firmware responds by preparing the PhySleep image as described above. The firmware then signals the DevSleep gate to power off.

When a Wake signal is asserted (e.g., on SATA pin 11), the wake process described herein begins. In one embodiment, takes approximately 23 ms; however, other configurations can have other timing. The timing illustrated in FIG. 9 conforms with SATA international Organization (SATA-IO) guidelines for example, Serial ATA Specification, Revision 3.0 (released June 2009) or subsequent specifications available from SATA-IO Administration in Beaverton, Oreg.

During the first 5 ms, the ASIC reset signal is deasserted. During the following 3 ms, the optimized boot load is loaded, the DRAM wakes and the image is detected. The image is loaded from the DRAM in the following 1 ms and the general firmware is reinitialized in the following 2 ms. The subsequent 10 ms are used for reinitialization of the SATA physical link and reinitialization of the SSD NAND memory. During the final 2 ms, the firmware transitions to the active state.

Figure 10:
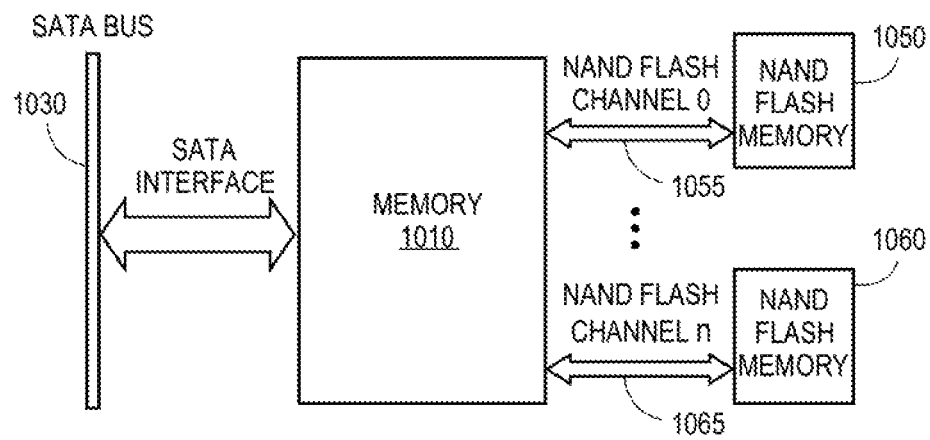
FIG. 10 is a block diagram of one embodiment of a solid state drive (SSD) system.

FIG. 10 is a block diagram of one embodiment of a solid state drive (SSD) system. The SSD of FIG. 10 can be a part of, for example, storage device 140 as illustrated in FIG. 1. The memory system of FIG. 10 may be utilized in other systems as well. Current SSD devices include both volatile and non-volatile memory (e.g., NAND) and use a logical-to-physical (L2P) indirection system (e.g., a lookup table) to store and retrieve user data. This L2P information and other drive state information together may be referred to as "context." The context can be maintained in volatile memory and may be periodically backed up to non-volatile memory.

Memory controller 1010 operates to manage the flow of data between one or more memory devices and a data source (not illustrated in FIG. 10). The data source may be, for example, a processor or other system component that may generate data or utilize data stored in memory. In one embodiment, memory controller 1010 communicates with SATA bus 1030 via SATA interface 1020 that provides an interface between memory controller 1010 and the data source.

In one embodiment, memory controller 1010 is a SATA-to-NAND controller that manages bandwidth between SATA bus 1030 and multiple NAND flash memory devices (e.g., 1050, 1060) over multiple NAND flash channels (e.g., 1055, 1065).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A storage device comprising:
   one or more non-volatile memory devices; and
   logic, coupled to the one or more non-volatile memory devices, to cause the one or more non-volatile memory devices to enter a low power consumption state in response to a first state of a device sleep (DEVSLP) signal to be received from a host, wherein the DEVSLP signal is to remain asserted by the host during the low power consumption state, wherein once the DEVSLP signal is deasserted, the one or more non-volatile memory devices are to initiate exit from the low power consumption state.

2. The storage device of claim 1, wherein the one or more non-volatile memory devices are to exit from the low power consumption state in response to a second state of the DEVSLP signal.

3. The storage device of claim 1, wherein the one or more non-volatile memory devices are to exit the low power consumption state in about 18 milli seconds (ms) in response to detection of a second state of the DEVSLP signal.

4. The storage device of claim 1, wherein the one or more non-volatile memory devices are to enter the low power consumption state in response to the first state of the DEVSLP signal and after storage of state information in volatile memory.

5. The storage device of claim 4, comprising logic to validate the state information prior to exit of the one or more non-volatile memory devices from the low power consumption state.

6. The storage device of claim 4, wherein the volatile memory is to enter self- refresh mode after storage of the state information in the volatile memory.

7. The storage device of claim 4, wherein the volatile memory is to comprise dynamic random access memory (DRAM).

8. The storage device of claim 7, wherein the DRAM is at least compliant with one or more double data rate 3 (DDR-3) or later standards.

9. The storage device of claim 4, wherein the state information is to comprise one or more of: memory controller state information, a buffer for storing bootloader instructions, or a verification checksum.

10. The storage device of claim 9, wherein the state information is to further comprise one or more of: state information corresponding to the one or more non-volatile memory devices or hardware state information.

11. The storage device of claim 1, wherein the storage device is to comprise a Solid State Device (SSD) and wherein the host is an SSD host.

12. The storage device of claim 1, further comprising a memory controller coupled to the one or more non-volatile memory devices and volatile memory to store memory controller state information, a buffer for storing bootloader instructions or a verification checksum.

13. The storage device of claim 12, wherein the one or more non-volatile memory devices and the volatile memory are to further store state information corresponding to the one or more non-volatile memory devices or hardware state information.

14. The storage device of claim 1, wherein the logic is to comprise firmware.

15. The storage device of claim 1, wherein the one or more non-volatile memory devices are to comprise NAND flash memory devices.

16. The storage device of claim 1, wherein the low power consumption state is to comprise a power down state.

17. The storage device of claim 1, wherein the DEVSLP signal is to be modified based at least in part on a value to be stored in a general purpose input/output (GPIO) register.

18. A host comprising:
    memory to store one or more instructions; and
    a processor, coupled to the memory, to execute the one or more instructions to generate a device sleep (DEVSLP) signal at a connector to cause one or more non-volatile memory devices to enter into a low power consumption state in response to a first state of the DEVSLP signal and to exit the low power consumption state in response to a second state of the DEVSLP signal, wherein the DEVSLP signal is to remain asserted by the host during the low power consumption state, wherein once the DEVSLP signal is deasserted, the one or more non-volatile memory devices are to initiate exit from the low power consumption state.

19. The host of claim 18, wherein the one or more non-volatile memory devices are to exit the low power consumption state in about 18 milli seconds (ms) in response to detection of the second state of the DEVSLP signal.

20. The host of claim 18, wherein the one or more non-volatile memory devices are to enter the low power consumption state in response to the first state of the DEVSLP signal and after storage of state information in volatile memory.

21. The host of claim 18, wherein the one or more non-volatile memory devices comprise a Solid State Drive (SSD).

22. The host of claim 18, further comprising a memory controller coupled to the one or more non-volatile memory devices.

23. The host of claim 18, wherein the one or more non-volatile memory devices are to comprise NAND flash memory devices.

24. The host of claim 18, wherein the low power consumption state is to comprise a power down state.

25. The host of claim 18, wherein the host is to comprise an SSD host.

26. The host of claim 18, wherein the connector is to comprise a pin.

27. A method comprising:
    causing one or more non-volatile memory devices of a Solid State Drive (SSD) to enter into a low power consumption state in response to a first state of a device sleep (DEVSLP) signal from an SSD host; and
    causing the one or more non-volatile memory devices to exit from the low power consumption state in response to a second state of the DEVSLP signal, wherein the DEVSLP signal is to remain asserted by the SSD host during the low power consumption state, wherein once the DEVSLP signal is deasserted, the one or more non-volatile memory devices initiate exit from the low power consumption state.

28. The method of claim 27, further comprising causing the one or more non-volatile memory devices to exit the low power consumption state in about 18 milli seconds (ms) in response to detection of the second state of the DEVSLP signal.

29. The method of claim 27, further comprising causing the one or more non-volatile memory devices to enter the low power consumption state in response to the first state of the DEVSLP signal and after storage of state information in volatile memory.

30. One or more non-transitory computer-readable medium comprising one or more instructions that when executed on at least one processor configure the at least one processor to perform one or more operations to:
cause one or more non-volatile memory devices of a Solid State Drive (SSD) to enter into a low power consumption state in response to a first state of a DEVSLP signal from an SSD host; and
cause the one or more non-volatile memory devices to exit from the low power consumption state in response to a second state of the DEVSLP signal, wherein the DEVSLP signal is to remain asserted by the SSD host during the low power consumption state, wherein once the DEVSLP signal is deasserted, the one or more non-volatile memory devices are to initiate exit from the low power consumption state.

31. The non-transitory computer-readable medium of claim 30, further comprising one or more instructions that when executed on the at least one processor configure the at least one processor to perform one or more operations to cause the one or more non-volatile memory devices to exit the low power consumption state in about 18 milli seconds (ms) in response to detection of the second state of the DEVSLP signal.

32. The non-transitory computer-readable medium of claim 30, further comprising one or more instructions that when executed on the at least one processor configure the at least one processor to perform one or more operations to cause the one or more non-volatile memory devices to enter the low power consumption state in response to the first state of the DEVSLP signal and after storage of state information in volatile memory.

* * * * *